United States Patent [19]

Eckstein et al.

[11] Patent Number: 5,364,492
[45] Date of Patent: Nov. 15, 1994

[54] METHOD OF DEPOSING BY MOLECULAR BEAM EPITAXY

[75] Inventors: James N. Eckstein, Cupertino; Ivan Bozovic, Palo Alto; Martin E. Klausmeier-Brown, San Jose; Gary F. Virshap, Cupertino, all of Calif.

[73] Assignee: Varian Associates, Inc., Palo Alto, Calif.

[21] Appl. No.: 947,003

[22] Filed: Sep. 17, 1992

[51] Int. Cl.⁵ .......................................... H01L 21/20
[52] U.S. Cl. .................................... 117/105; 356/309; 356/310; 356/319; 356/320
[58] Field of Search ................ 156/601; 437/105, 107, 437/126, 133; 356/306, 307, 308, 319, 320, 309, 310

[56] References Cited

U.S. PATENT DOCUMENTS

| | | | |
|---|---|---|---|
| Re. 32,022 | 11/1985 | Parker et al. | 356/307 |
| 4,159,919 | 7/1979 | McFee et al. | 437/105 |
| 4,462,685 | 7/1984 | Smith, Jr. et al. | 356/307 |
| 4,786,616 | 11/1988 | Awal et al. | 437/105 |
| 4,855,013 | 8/1989 | Ohta et al. | 156/601 |
| 5,089,104 | 2/1992 | Kanda et al. | 204/192.11 |

FOREIGN PATENT DOCUMENTS 1-249693  10/1989  Japan .

OTHER PUBLICATIONS

Klausmeier-Brown et al "Acurate measurement of Atomic Beam flux by Pseudo-double-beam atomic absorption spectroscopy for growth of thin-film oxide superconductors" in Appl. Phys. Letters 60 (1992), 657-659.

Kometani et al "Measurement of Ga and Al in a Molecular-Beam Epitaxy Chamber by Atomic Absorption Spectroscopy (AAS)" in J. Vac. Sci. Technol. 12(1975), 933-936.

Primary Examiner—R. Bruce Breneman
Assistant Examiner—Ramamohan Rao Paladugu
Attorney, Agent, or Firm—Gerald M. Fisher

[57] ABSTRACT

A new method for accurately and sequentially growing monolayers and creating new superlattice structures employing a MBE thermal source control technique employing a quasi-double beam atomic absorption background correction measurements with the beam blocked and with the beam unblocked and by calculating the concentration based on the:

$$\sigma n l = \ln \frac{I_{out}}{I_{in}}$$

and applying corrections for non-linear absorption curves because of comparable spectral bandwidth of the molecular beam.

12 Claims, 2 Drawing Sheets

METHOD OF DEPOSING BY MOLECULAR BEAM EPITAXY

FIELD OF THE INVENTION

This invention relates to improvements in the technique for measuring beam flux from thermal sources used in MBE systems.

BACKGROUND OF THE INVENTION

Molecular Beam Epitaxy (MBE) systems employ super high vacuum chambers equipped with a means to grow layers on a substrate by evaporation of source materials and controllable means to direct beams of such source materials toward said substrate.

Several ways to measure beam fluxes have also been reported in connection with MBE. These include pressure gauges, such as ionization gauges, placed in the beam path. These gauges respond to different materials differently, an effect which cannot be eliminated and they are difficult to compensate.

Optical techniques including reflection high energy electron diffraction, RHEED, atomic absorption and resonance fluorescence have also been employed. RHEED only gives meaningful data when monitoring growth which naturally grows layer by layer. This technique is inapplicable to many complex crystal structures.

Other MBE apparatus have traditionally employed crystal rate monitors to measure flux from the source. Most such monitor devices were unable to provide an accuracy greater than 5% and in general they were unable to be placed in the direct beam. These monitors could not differentiate between atomic species and do not have sufficient sensitivity for modern sequential deposition methods.

Atomic absorption (AA) has been used earlier in conjunction with MBE as disclosed in Japanese application No. 63-77799, filed Mar. 30, 1988. However, in prior art atomic absorption (AA) systems, the systems have not properly compensated for all the sources of error, such as changes in absorbance due to window coating, variations in the AA source lamp current, or in the circuit drifts or absorption due to other materials. AA spectroscopy is a known technique for making precise, very low density measurements. Many error correcting techniques and background correction techniques have been employed in AA spectroscopy. Each such prior art correction technique has generally depended on the fact that in traditional AA that the line width of the probing beams is at least 3-10 times narrower than the line width of the atoms in the sample cloud. In prior art AA, the sample cloud atoms are typically at 1 atmosphere pressure at elevated temperature, i.e. T>1000° C. In an MBE, the pressure range is typically much lower, and can be low as $10^{-10}-10^{-11}$ Torr and the line width of the atom spectra are of the same order but narrower than the line width from the hollow cathode lamp probe beam.

Atomic absorption techniques as part of process control in sputtering is also known as shown in U.S. Pat. No. 5,089,104. In the '104 patent, the concentration of sputtered particles from the is measured via atomic absorption and compared to calibration ratio data. No background absorption error or electrical drift error compensation is indicated and the only feedback control is to maintain the power level to the ion beam sources to provide the calibration ratio values. Calibration techniques in atomic absorption spectroscopy measurements involving dual beams is also well known. Compensation for the absorption from interfering materials and for the electronic drifts of the source lamp are corrected by log ratio comparison of the received transmitted intensity of a probe beam signal in the two paths. This double beam technique introduces an error because the optical components of the two paths are not identical because of different elements such as lens or window coatings and because different electrical detectors may be involved, each of which also introduce errors.

There are also several known single beam background AA correction techniques. It is known to modulate with two different cathode source lamp currents, where one is an overdriven hollow cathode lamp current such as described in U.S. Pat. No. 4,462,685. That scheme provides a different lamp intensity at the absorber wavelength for the two values of lamp current. So long as complete characterization of the spectral output of the lamps are available, ratio comparison of the two signals can correct for background induced errors. However, this technique does not work for all elements and causes instabilities in other lamp sources. Another single beam approach employs the so-called Zeeman effect as described in U.S. Pat. Re. No. 32022. This Zeeman system is a relatively complex and expensive system requiring an alternating magnetic field applied to the sample for best results.

There is a need for a long term stable, simple, reliable and precise, background corrected and normalized single beam technique which doesn't require magnetic splitting of the vapors or overdriving of the source lamps in order to measure the flux from thermal sources in an MBE system.

SUMMARY OF THE INVENTION

It is an object of this invention to provide a technique for highly sensitive and extremely accurate measuring of atomic flux in an MBE system.

It is a further object to provide a single beam atomic absorption measurement technique with a double beam type ratio scheme for correcting for lamp intensity drift, photomultiplier gain drift, window coating, and other electronic changes in addition to corrections for other background absorption effects.

DETAILED DESCRIPTION OF THE INVENTION

Our inventive technique for measuring source flux uses a single beam path and single channel electronics approach which enables automatic correction for background absorption and the various electronic circuit drifts. The technique employs the strategy of determining the concentration of atoms in the atomic beam by measuring the absorption of a single probe light in a single path, both with the full atomic beam on and then with the full atomic beam off and by taking the ratio of the two measurements. This provides correction for the electronic circuit drifts and background absorption and attenuation. We also mechanically chop the probe light at an intermediate rate and use a lock-in amplifier to synchronously detect only the difference between the on-off probe beam transmitted beam.

Our technique is so accurate that we can selectively grow single atomic layers as evidenced by both RHEED measurements and post growth film analysis by X-ray diffraction. Our technique enables compounds to be grown by sequentially growing/applying one atomic layer of one constituent and then switching to another constituent. Since the thickness of a grown layer is directly proportional to the time integral of the concentration of the beam, the accuracy is dependent upon a time measurement, a concentration measurement and a constant of integration. Time is able to be measured extremely accurately. Using our technique employing on-and off atomic beam measurements has enabled concentration measurement to be accomplished with great accuracy and precision.

Figure 1:
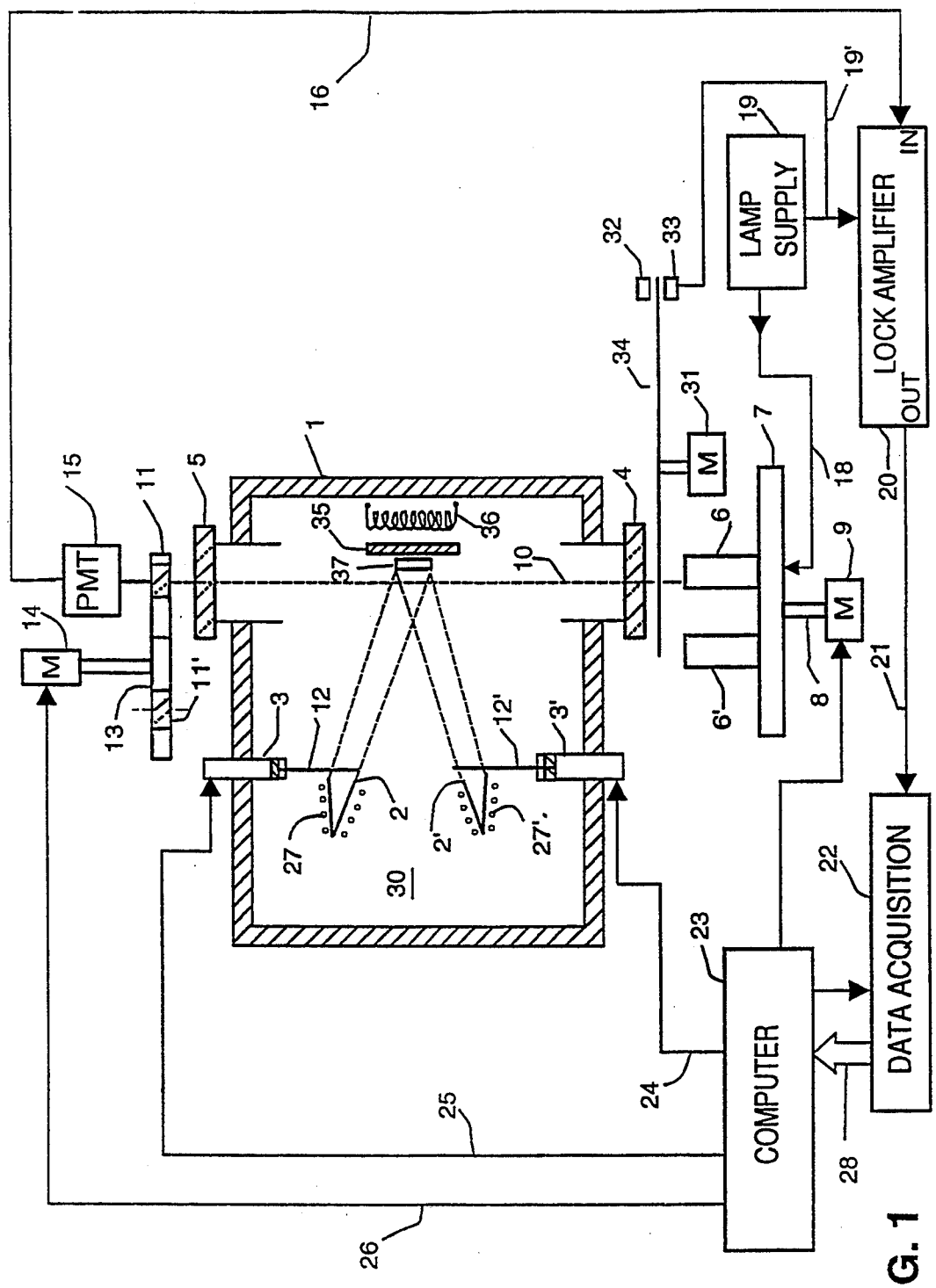
FIG. 1 is a block diagram of the MBE system supporting a pseudo double beam atomic absorption flux measurement.

With reference to FIG. 1, the hollow cathode lamps 6, 6' etc., one lamp for each element, can be mounted on a multi-element turret 7, outside the MBE chamber 30. The turret is rotatable by motor 9 to align the source lamp axis 10 with the probe beam windows 4 and 5 in the MBE vacuum system outside walls 1. Alternatively, fixed position source lamps can be mounted around the periphery of the MBE system 30. The only critical alignment issue is that the probe beam axis 10 pass just above the substrate 37 on which the layers are being grown. Depending on the element being used, motor 14 is rotated to select the appropriate filter 11 or 11', etc., and place it between the source lamp and the photomultiplier detector 15. The filter will eliminate all of those lines from the source lamp except the one of interest. The high vacuum chamber 30, at pressures on the order of $10^{-10}$ to $10^{-11}$ T contains thermal sources, 2 and 2', surrounded by heater coils, 27 and 27' for providing atomic beams of evaporated selected atoms. The mouths of the thermal sources are generally aligned in the direction of the substrate 37. Across the mouth of each thermal source 27, 27' is a shutter 12, 12' connected to the actuator 3 and 3'. When the actuator closes, it entirely closes off the line of sight from the mouth of the source 2, 2', to the substrate 37. Substrates 37 can be held at elevated temperatures via backing plate 35 and heater coil 36 in conjunction with temperature monitoring feedback, not shown. A DC lamp supply 19 turns on the lamp currents of the selected and actuated lamp, aligned on axis 10. A mechanical chopper 34 interrupts the probe beam under control of motor 31 at an intermediate rate, i.e., 50 Hz. This alternating light and dark period permits elimination of any non-synchronous signal and baseline drifts. The lock-in amplifier 20, receives the pulsations from the lamp 6 or 6', and the chopping frequency from the chopper detector 33 sensing interruptions in the beam from the diode light source 32. Lock-in amplifier 20 synchronously detects the signal from the PMT 15. The lock-in-amplifier 20 provides an analogue output signal to data acquisition processor 22 on line 21. The processor 22 includes a analogue to digital convertor (A/D) which provides a high accuracy, multibit output word representative of the analogue value of the intensity of the signal. The output to the computer is provided in parallel connector 28 to the computer. Computer 23, stores the values of the A/D signal obtained for both the conditions when the shutter is in open and in closed positions and the computer performs the logarithm of the ratio comparison of these two signals to determine a corrected concentration measurement. For those elements and for those concentrations for which the calibration curve is not linear due to the fact that the probe beam is of a broader linewidth than the absorber, a calibration curve is employed to establish the corrected concentration level. This technique can also be employed with AC excited source lamps and synchronous detection.

The computer calculates the flux of the particular element which intercepted the substrate 3 during the time that the shutters 12 or 12' were in the open position. From the above data, the program computes the layer thickness and determines whether to proceed with the same element by reopening the shutter or to command a switch to the next element. If another element is desired, the appropriate hollow cathode lamp 6' is selected and, if necessary moved into position and the appropriate filter 11' is also selected, and if necessary moved into position. The embodiment of FIG. 1 for selecting lamps shows a turret driven motor 9. The turret contains a plurality of different hollow cathode lamps. It may be more convenient to have a plurality of windows 4 and 5 in the chamber circumference aligned to fixedly attached lamps 6 and 6'. In the configuration, with intersecting probe beams, several beams can be layering simultaneously, and each beam can be measured and accurately corrected, simultaneously by controlling the shutters of each source which are being periodically turned on and off to provide background absorption correction measurements.

Figure 2:
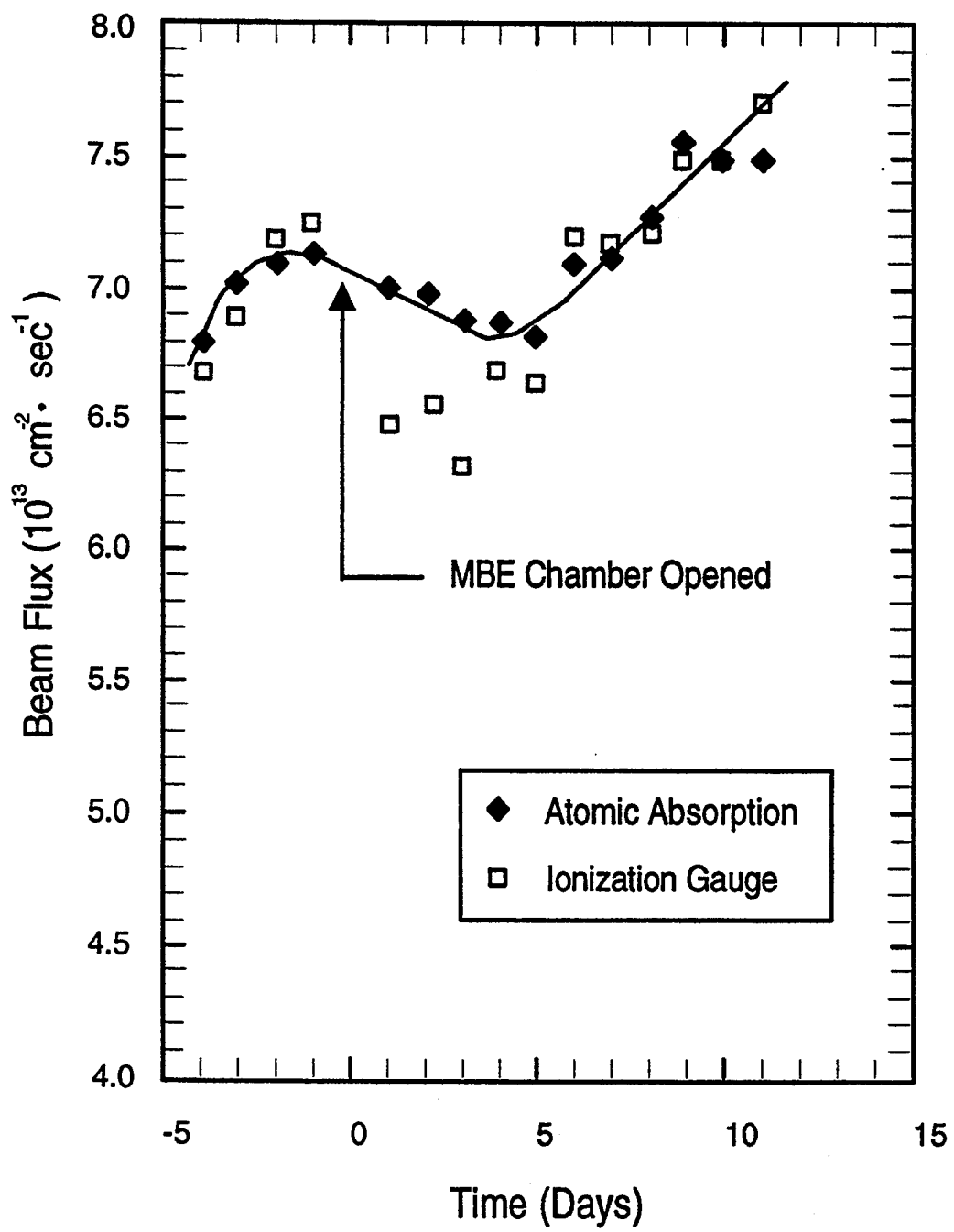
FIG. 2 is a graph of flux vs. time for strontium source using both the pseudo double beam atomic absorption flux measurement approach and the ionization gauge measurement technique.

In our experiments, we have compared the stability of our new system to the prior ionization gauge approach. With reference to FIG. 2, our experiments demonstrate, over a period of three weeks, that our strontium atomic beam flux changes significantly from day to day even though the source temperature is constant. We believe this flux change to be due to source material depletion and/or physical redistribution. In view of these changes, to enable atomic layer by layer growth control we must be able to accurately compensate for these changes. We particularly noted that during the week immediately following opening of the MBE growth chamber to the atmosphere that the ionization gauge results were less accurate, most likely due to water vapor or other residual gas absorbed by the source material when the chamber was open.

Because of the fact that the atomic absorption technique measures atomic concentration, i.e. atomic density, our system calibration has a slight error when the effusion source temperature changes. We have assumed that the thermal velocity of the atoms in the beam is constant which fact is not true when the temperature varies. We have determined that this factor results in a non-linearity in the apparent beam flux on the order of 0.05% per °C. We occasionally adjust the source temperature by 10° C. which may result in non-linearity of less than 0.5%. Also, the computations carried out by our computer assume that the absorption follows the Beer-Lambert law, namely $$I_{out} = I_{in}e^{-\sigma l n} \text{ and } \ln \frac{I_{out}}{I_{in}} = -\sigma n l$$

where
  $\sigma$ = absorption cross-section constant n = number of atoms per unit volume
l = length of the absorber path
$I_{in}$ = intensity of the probe beam from the source lamp of wavelength $\lambda$.
$I_{out}$ = intensity after the probe beam is absorbed by atoms having resonant line of wavelength $\lambda$.

In view of the fact that in the MBE de-rice the pressure is quite low, the line width of the probe beam is on the same order as the line width of the absorber. It can be shown that this condition leads to a non-linearity of the absorption curve, as a function of n. Our calculations compensate for this error by reference to calibration curves for each value of n measured. We have determined that the non-linearity causes the relationship to follow the form $$\sigma n l = -\ln\left[\frac{I_{out}}{I_{in}} - k\left(1 - \frac{I_{out}}{I_{in}}\right)\right]$$

where K is a constant characteristic of the spectral overlap of the lamp and atomic beam profiles.

We have accurately measured the transmittance for the concentrations of interest and we refer to these curves to correct our absorbance readings.

Our pseudo-double beam measurement system is immune to spurious absorption and/or reflection from windows, photomultiplier and lock-in amplifier gain changes and/or optical source drift or decay. The method is limited by the rate of effusion source temperature fluctuation and RBS calibration accuracy.

We have demonstrated atomic layer-by-layer molecular beam epitaxy of high temperature superconducting compounds of Bi-Sr-Ca-Cu-O (BSCCO) in our MBE System by sequential shuttering of single element thermal effusion sources in an ozone atmosphere. The shuttering times were chosen to deposit individual monolayers of each element, one element at a time. This produces an in situ 2212-phase BSCCO films with superconducting temperature $T_c$ equal to 87° C. and $j_c > 5 \times 10^6$ A/cm$^2$ current density at 4.2° K. Films grown in this system are optically smooth, with a roughness of <10Å, measured by atomic force and scanning tunneling microscopy. Atomic layer by layer growth has been confirmed by atomic layer modulation of the reflection high energy electron diffraction high energy pattern (RHEED) through the film growth. We also fabricated -axis oriented superlattices in which single formula unit layers (i.e., half unit cell layers) of high $T_c$, 2212-phase BSCCO alternate with p formula unit layers of low $T_c$ 2201 phase BSCCO. The $T_c$ in these superlattices was not degraded relative to pure BSCCO even though it is very difficult to obtain intrinsic superconducting properties in such superlattices. These results demonstrate reliability of our pseudo double beam systems to accurately control layer-by-layer growth. Other atmospheres are envisioned during growth including chlorine, fluorine, bromine, nitrogen or hydrogen and ions and neutral atomic radicals thereof. The invention herein has been described in conjunction with the specific embodiment of the drawings. It is not our intention to limit our invention to any specific embodiment and the scope of the invention should be determined by our claims.

With this in view, What is claimed is:

1. In a method for controlling layer growth on a substrate in an MBE growth chamber, including:

(a) mounting in the path of a selected first and second atomic beams from a first and second thermal effusion source of atoms in said MBD growth chamber a substrate to be layered with a first layer of a first thickness of atoms from said first effusion source and a second layer of a second thickness of atoms from said second effusion source;

(b) opening a first shutter between said first source and said substrate to commence depositing a first layer;

(c) performing a first measurement of the intensity of a probe beam after said probe beam transits through said selected atomic beam, said probe beam being light from a lamp containing the same atoms as in said selected atomic beam;

(d) shutting off said first atomic beam by closing said first shutter between said first effusion source and said substrate;

(e) performing a second measurement of the intensity of said probe beam after said probe beam transits exactly the same path in said growth chamber as in said first measurement except that the said first atomic beam is closed during said second measurement;

(f) comparing said first and second measurement;

(g) calculating the thickness of the first layer deposited on said substrate using the result of said comparing step;

(h) responsive to said calculating step, if said thickness is within a selected tolerance of said first thickness said shutter shall remain closed, but if the thickness of the first deposited layer on said substrate is less than said first thickness, repeat steps (b) through (h); and (i) after completion of step (h) and said first layer thickness is within said selected tolerance of said thickness, undertaking the steps of, (j) changing the lamp emitting said probe beam to a lamp containing the same atoms as in a second thermal effusion source;

(k) opening said second shutter which is interposed in said second atomic beam path between said second thermal effusion source containing a second selected atom and said substrate, (l) performing a third intensity measurement of the intensity of said probe beam after said probe beam through said second atomic beam;

(m) shutting off said second atomic beam by closing said second shutter between said second effusion source and said substrate;

(n) performing a further measurement of the intensity of said probe beam after said probe beam transits exactly the same path in said growth chamber as said third intensity measurement except that the said second atomic beam is shuttered;

(o) comparing said third and fourth intensity measurement;

(p) calculating said thickness of the second layer deposited on said substrate using the results of said comparing step of said third and fourth intensity measurements;

(q) responsive to said calculating step (o) causing the said second shutter to move to said open position only if the thickness of said second deposited layer on said substrate is less than said second amount; and (r) wherein said calculations steps (g) and (p) includes a correction for non-linearity due to the fact that the probe beam line width is on the same order of magnitude as the line width of the absorption line spectra of atoms in said atomic beam path.

2. The method of claim 1 wherein said step (f) comprises calculating the logarithm of the ratio of said first and second measurements.

3. The method of claim 2 wherein the step (o) comprises calculating the logarithm of the ratio of the said third and fourth measurements.

4. The method of claim 4 wherein a first wave length filter selected for said first and second measurement is interposed between in said probe beam source lamp and said photomultiplier.

5. The method of claim 4 wherein a second wavelength filter selected for said third and fourth measurement is interposed between said second source lamp and photomultiplier means.

6. The method of claim 1 wherein after completion of step (p) and said second deposited layer is within said selected tolerance of said second amount, the steps of:
 (a) repeating steps (i) through (p) for any number of elements N by providing in said MBE a thermal effusion source for each said element N including a shutter for it, and a probe beam from a light source containing the atoms as said element N.

7. In a method for growing complex compounds on a substrate in an MBE growth chamber, comprising:
 (a) mounting a substrate in said growth chamber;
 (b) establishing a line of sight between the mouth of a plurality of effusion atomic beam sources and said substrate;
 (c) interposing a shutter in said line of sight between each said plurality of effusion atomic beam sources to enable blocking and unblocking said line of sight;
 (d) establishing a plurality of atomic absorption beams of the same frequency as a resonance line of said atoms in said effusion source;
 (e) sequentially depositing a layer of said first atomic beam material and then a second layer of said second atomic beam material;
 (f) controlling each said layer thickness by calculations responsive to intensity measurements made with the said shutters closed and said shutters open.

8. The method in claim 7 wherein step (e) includes providing reactive gases in said chamber during said step of depositing a layer.

9. The method of claim 7 wherein said controlling step includes the calculation of a logarithm of the ratio of the intensity transmitted of a probe beam with the shutter open and with the shutter closed.

10. The method of claim 9 where the said controlling step further including a calculation of the atomic flux by integrating over time to determine the rate of deposition.

11. The method of claim 6 wherein said reactive gas is selected from the group consisting of oxygen, chlorine, fluorine, bromine, nitrogen or hydrogen and ions and neutral atomic radicals thereof.

12. The method of claim 10 wherein said calculation includes a correction for non-linearity of absorption because said atomic probe beams have a bandwidth which is larger than the bandwidth of the atomic beam from said effusion sources wherein said correction following the equation $$\sigma n l = -\ln\left[\frac{I_{out}}{I_{in}} - K\left(1 - \frac{I_{out}}{I_{in}}\right)\right]$$

where:
$\sigma$ = cross section
n = number of atoms
l = length of beam path through the atoms
$I_{out}$ = intensity of the hollow cathode lamp after transmission through the molecular beam absorbers
$I_{in}$ = intensity of hollow cathode lamp before impinging on the molecular beam
K = constant which is a function of spectral overlap.

* * * * *